US007342965B2

(12) United States Patent
Lainema

(10) Patent No.: US 7,342,965 B2
(45) Date of Patent: Mar. 11, 2008

(54) ADAPTIVE METHOD AND SYSTEM FOR MAPPING PARAMETER VALUES TO CODEWORD INDEXES

(75) Inventor: Jani Lainema, Irving, TX (US)

(73) Assignee: Nokia Corporation, Espoo (FI)

( * ) Notice: Subject to any disclaimer, the term of this patent is extended or adjusted under 35 U.S.C. 154(b) by 873 days.

(21) Appl. No.: 10/423,486

(22) Filed: Apr. 25, 2003

(65) Prior Publication Data

US 2004/0037461 A1    Feb. 26, 2004

Related U.S. Application Data

(60) Provisional application No. 60/376,117, filed on Apr. 26, 2002.

(51) Int. Cl.
*H04N 7/18*     (2006.01)
(52) U.S. Cl. .............................. 375/240.23; 375/240.26
(58) Field of Classification Search ................................
375/240.01–240.29
See application file for complete search history.

(56) References Cited

U.S. PATENT DOCUMENTS

| 4,413,289 | A | | 11/1983 | Weaver et al. ................. 360/51 |
| 6,046,774 | A | * | 4/2000 | Heo et al. ............... 375/240.16 |
| 6,151,360 | A | | 11/2000 | Kato et al. ............. 375/240.03 |
| 6,195,778 | B1 | * | 2/2001 | Tran ........................... 714/752 |
| 6,310,980 | B1 | | 10/2001 | Kajiwara .................... 382/238 |
| 6,333,949 | B1 | | 12/2001 | Nakagawa et al. .... 375/240.16 |
| 6,438,167 | B1 | | 8/2002 | Shimizu et al. ........ 375/240.03 |
| 6,567,117 | B1 | | 5/2003 | Nago et al. ................. 348/180 |
| 6,567,562 | B1 | | 5/2003 | Nakayama et al. ......... 382/246 |
| 6,696,993 | B2 | * | 2/2004 | Karczewicz ................. 341/67 |

OTHER PUBLICATIONS

IEEE Transactions on Image Processing, vol. 5, No. 3; Seongkwon et al.; "A Statistical Fe"; pp. 527; Mar. 1996; IEEE Service Center, Piscataway, NJ, USA.

* cited by examiner

*Primary Examiner*—Andy Rao
(74) *Attorney, Agent, or Firm*—Ware, Fressola, Van Der Sluys & Adolphson, LLP

(57) ABSTRACT

A method and system for entropy coding, where parameters indicative of a coded signal are mapped into codeword indexes so that a decoder can reconstruct the coded signal from the codeword indexes. When the parameter space is limited such that the coding is inefficient in that the codewords are not arranged in an orderly or contiguous fashion corresponding to the parameters, a sorting step is used to sort the parameters into different groups so that parameters in different groups are mapped into the codeword indexes in different manners such that the codeword indexes corresponding to the parameters are assigned in a contiguous and orderly manner. The sorting can be based on the absolute values of the parameters in relation with a selected value. In the decoding process, the codewords indexes are also sorted into different groups based on the value of codewords indexex in relation to the selected value.

28 Claims, 3 Drawing Sheets

ADAPTIVE METHOD AND SYSTEM FOR MAPPING PARAMETER VALUES TO CODEWORD INDEXES

The patent application is based on and claims priority to U.S. Provisional Application No. 60/376,117, filed Apr. 26, 2002.

FIELD OF THE INVENTION

The present invention relates generally to a coding system and, more particularly, to a video coding and decoding system.

BACKGROUND OF THE INVENTION

Typical video codecs are based on motion compensated prediction and prediction error coding. Motion compensated prediction is obtained by analyzing and coding motion between video frames and reconstructing image segments using the motion information. Prediction error coding is used to code the difference between motion compensated image segments and corresponding segments in the original image. The accuracy of prediction error coding can be adjusted depending on the available bandwidth and required quality of the coded video. In a typical Discrete Cosine Transform (DCT) based system this is done by varying the quantizer parameter (QP) used in quantizing the DCT coefficients to specific accuracy.

Coding systems, in general, provide a set of parameters to represent the coded signals. These parameters are entropy coded and sent to the decoder for decoding and reconstruction of the coded signal. To improve the compression performance of the entropy coder, the parameters are often predicted from the information available for both encoder and decoder. By doing this, the entropy coder needs to code only small variance differences between the actual parameter values and the predicted ones leading into coding gain. The encoding process is illustrated in FIG. 1.

As shown in FIG. 1, input signal indicative of an image segment in a video sequence is provided to a parameter creation block, where a set of parameters representing the input signal are created. Based on the parameters created by the parameter creation block, a parameter prediction block is used to provide a set parameters represented a motion-compensated prediction image segment. A subtracting module is then used to compute the difference between the actual parameters and the predicted ones for providing the parameter differences p. The parameter differences p are encoded by an entropy coder to provide a set of codewords, so as to allow a decoder to reconstruct the input signal from the codewords.

In a typical case, the entropy coder assumes that the most probable parameter difference is zero and the small differences are always more probable than larger deviations from the predictor. Thus, the entropy coder can map the parameter differences to codeword indexes in the order of descending probability using the formula below.

$$c = 2\,abs(p) - sign(p), \quad (1)$$

where abs(p) denotes the absolute value of the parameter difference p, sign(p) is the sign of the parameter difference p, and c is the codeword index. More specifically, $$sign(p) = \begin{cases} +1 & \text{for } p > 0 \\ 0 & \text{for } p \leq 0 \end{cases}$$

It can be seen that, in the decoder, the parameter difference p can be easily reconstructed by inverse mapping as follows:

$$p = isign(c)(c + odd(c))/2, \quad (2)$$

where isign(c) is determined by whether c is an even number or an odd number. More specifically, $$isign(c) = \begin{cases} -1 & \text{for } c \text{ even} \\ +1 & \text{for other } c. \end{cases}$$

odd(c) is 1 if c is odd and 0 otherwise.

Using these equations, the mapping of parameter differences p to codeword indexes c looks like:

| p | ... | −6 | −5 | −4 | −3 | −2 | −1 | 0 | 1 | 2 | 3 | 4 | 5 | 6 | ... |
|---|---|---|---|---|---|---|---|---|---|---|---|---|---|---|---|
| c | ... | 12 | 10 | 8 | 6 | 4 | 2 | 0 | 1 | 3 | 5 | 7 | 9 | 11 | ... |

Now, the codeword indexes are mapped in descending order of probability and can be efficiently coded, for example, using Exponential Golomb Codes.

When the coding parameters are within a limited range, the result is undesirable. For example, if the range of the parameter (or parameter difference as discussed above) p can only have values between −6 and 1, the mapping of p to codeword indexes c using Equation 1 would yield

| p | −6 | −5 | −4 | −3 | −2 | −1 | 0 | 1 |
|---|---|---|---|---|---|---|---|---|
| c | 12 | 10 | 8 | 6 | 4 | 2 | 0 | 1 |

This mapping leads to significant reduction in compression performance, since codeword indexes 3, 5, 7, . . . are never used.

Prior art solution to this coding inefficiency is to use straightforward modulo arithmetic or circular mapping method to map the unused indexes to valid ones. This approach maps the overflowing indexes (3, 5 and 7 in the example below) to the other end of the parameter space. As such, the indexes 12, 10 and 8 are mapped to 3, 5 and 7, respectively.

The advantage of this method is the straightforward calculation, but on the other hand, it leads to suboptimal performance since low probability parameters from the other end of the parameter space are mapped to small (i.e. high probability) codeword indexes, such as 3 and 5. Table below demonstrates this kind of mapping when parameters have valid values from −6 to 1.

| p | −6 | −5 | −4 | −3 | −2 | −1 | 0 | 1 |
|---|---|---|---|---|---|---|---|---|
| c | 3 | 5 | 7 | 6 | 4 | 2 | 0 | 1 |

As such, the use of Exponential Golomb Codes for coding may not be efficient.

Thus, it is advantageous and desirable to provide a coding method and system wherein the mapping from the parameter differences or the parameters to codeword indexes is optimal, regardless of the limited range of the parameter differences or parameters.

SUMMARY OF THE INVENTION

It is a primary object of the present invention to improve compression performance when the coding parameters are within a limited range, such that there are no gaps in the codeword indexes and the codeword indexes are mapped in an orderly fashion. The object can be achieved by sorting the parameter differences or the parameters themselves. Prior to entropy coding, the parameter differences or the parameters are sorted into at least a first group and a second group, such that if the absolute value of the parameter difference (or parameter) is smaller than or equal to a selected value, the parameter difference (or parameter) is put into the first group, otherwise it is put into the second group. The mapping of the parameter differences (or parameters) in the first group is based on the absolute values and the signs of the parameter differences (or parameters). The mapping of the parameters differences (or parameters) in the second group is based on the absolute values of the parameter differences (or parameters).

Thus, according to the first aspect of the present invention, there is provided a method of coding an input signal for providing a set of parameters indicative of the coded signal, wherein differences between the parameters and a predicted value are further mapped in an encoder into a plurality of codeword indexes, the codeword indexes indicative of a plurality of codewords for use in coding the differences or parameters, so as to allow a decoder to reconstruct the input signal based on the codewords. The coding method is characterized by sorting the differences or parameters into at least a first group and a second group;

mapping the differences or parameters in the first group based on absolute values and signs of the differences or parameters; and mapping the differences or parameters in the second group based on the absolute values.

The sorting is based on the absolute values of the differences or parameters such that the absolute value of each of the differences or parameters in the first group is equal to or smaller than a selected value. The codeword indexes mapped from differences or parameters in the second group are indicative of the sum of the absolute values of the differences or parameters and the selected value.

The parameters can be the Quantization Parameters of a video coding system.

The input signal can be a video signal in a video coding system.

The input signal can be an audio signal in an audio coding system.

The input signal can be a data signal in a data coding for transmission or storage.

Advantageously, said mapping is performed such that the codeword indexes corresponding to said differences or parameters are contiguously assigned.

According to the second aspect of the present invention, there is provided an entropy encoder for coding an input signal for providing an encoded signal. The encoder comprises:

means for providing a set of parameters indicative of the coded signal;

means for providing at least a predicted value;

means, responsive to the parameters and the predicted value, for providing differences between the parameters and the predicted value;

means, responsive to the differences or the parameters, for providing a plurality of codeword indexes, the codeword indexes indicative of a plurality of codewords for use in coding the differences or parameters, so as to allow a decoder to reconstruct the input signal based on the codewords. The encoder is characterized by a sorting module for sorting the differences or parameters into at least a first group and a second group;

a mapping module, operatively connected to the sorting module, for mapping the differences or parameters in the first group based on absolute values and signs of the differences or parameters, and the differences or parameters in the second group based on the absolute values, so as to provide said plurality of codeword indexes.

The encoder can be implemented in a video coder for encoding video signal.

The encoder can be implemented in an audio coder for encoding audio signal.

The encoder can be implemented in a data coder for encoding data signal for transmission or storage.

According to the third aspect of the present invention, there is provided an entropy decoder for reconstructing a coded signal from a set of codeword indexes, said decoder comprising:

means for providing a predicted value of the coded signal;

means for converting the set of codeword indexes to a set of parameter differences;

means, responsive to the parameter differences and the predicted value, for providing a set of parameters indicative of the coded signal, and means, responsive to the set of parameters, for providing the coded signal. The decoder is characterized by a sorting module for sorting the codeword indexes into at least a first group and a second group;

a mapping module, operatively connected to the sorting module, for mapping the codeword indexes in the first group based on whether the codeword indexes are even numbers or odd numbers, and mapping the codeword indexes in the second group based on differences between the codeword indexes and a selected value, so as to provide the parameter differences.

The sorting is based on values of codeword indexes in relation to the selected value such that each of the codeword indexes in the first group is equal to or smaller than two times the selected value.

According to the fourth aspect of the present invention, there is provided an entropy coding and decoding system, which includes:

a decoder, and an encoder for coding an input signal for providing an encoded signal, wherein the encoder comprises:

means for providing a set of parameters indicative of the coded signal;

means for providing at least a predicted value;

means, responsive to the parameters and the predicted value, for providing differences between the parameters and the predicted value;

means, responsive to the differences or the parameters, for providing a plurality of codeword indexes, the codeword indexes indicative of a plurality of codewords for use in coding the differences or parameters, so as to allow the decoder to reconstruct the input signal based on the codewords. The coding and decoding system is characterized by:

a sorting module in the encoder for sorting the differences or parameters into at least a first group and a second group;

a mapping module in the encoder, operatively connected to the sorting module, for mapping the differences or parameters in the first group based on absolute values and signs of the differences or parameters, and the differences or parameters in the second group based on the absolute values, so as to provide said plurality of codeword indexes.

The sorting is based on the absolute values of the differences or parameters such that the absolute value of each of the differences or parameters in the first group is equal to or smaller than a selected value. The codeword indexes mapped from the differences or parameters in the second group are indicative of the sum of the absolute values of the differences or parameters and the selected value.

According to the fifth aspect of the present invention, there is provided a software program for use in an encoder, that is used for coding an input signal for providing an encoded signal, wherein the encoder comprises:

means for providing a set of parameters indicative of the coded signal;

means for providing at least a predicted value;

means, responsive to the parameters and the predicted value, for providing differences between the parameters and the predicted value;

means, responsive to the differences or the parameters, for providing a plurality of codeword indexes, the codeword indexes indicative of a plurality of codewords for use in coding the differences or parameters, so as to allow the decoder to reconstruct the input signal based on the codewords. The software program is characterized by:

a code for sorting the differences or parameters into at least a first group and a second group; and a code for mapping the differences or parameters in the first group based on absolute values and signs of the differences or parameters, and the differences or parameters in the second group based on the absolute values, so as to provide said plurality of codeword indexes.

The sorting is based on the absolute values of the differences or parameters such that the absolute value of each of the differences or parameters in the first group is equal to or smaller than a selected value. The codeword indexes mapped from the differences or parameters in the second group are indicative of the sum of the absolute values of the differences or parameters and the selected value.

According to the sixth aspect of the present invention, there is provided a software program for use in a decoder, which is used for reconstructing a coded signal from a set of codeword indexes, wherein the decoder comprises:

means for providing a predicted value of the coded signal;

means for converting the set of codeword indexes to a set of parameter differences;

means, responsive to the parameter differences and the predicted value, for providing a set of parameters indicative of the coded signal, and means, responsive to the set of parameters, for providing the coded signal. The software program is characterized by a code for sorting the codeword indexes into at least a first group and a second group; and a code for mapping the codeword indexes in the first group based on whether the codeword indexes are even numbers or odd numbers, and mapping the codeword indexes in the second group based on differences between the codeword indexes and a selected value, so as to provide the parameter differences.

The sorting is based on values of codeword indexes in relation to the selected value such that each of the codeword indexes is equal to or smaller than two times the selected value. Each of the parameter differences mapped from the codeword indexes in the second group is computed from p=msign(c)(c−n), where msign(c) is the sign of the p with maxiumum absolute value.

The present invention will become apparent upon reading the description taken in conjunction with FIGS. 2 and 3.

BEST MODE FOR CARRYING OUT THE INVENTION

The present invention divides the limited parameter difference space into two parts. The first part consists of the parameter differences p having absolute value equal to or smaller than n (n is either the absolute value of the minimum or the absolute value of the maximum allowed parameter difference p, whichever is smaller). The second part contains all the other valid parameter differences p.

The first part of the parameter differences p is optimally mapped to codeword indexes using Eq. 1. The optimal mapping for the second part is linear, starting from the number of indexes in the first part. The mapping in the encoder is given by the equation below.

$$c = \begin{cases} 2\mathrm{abs}(p) - \mathrm{sign}(p), & \mathrm{abs}(p) \le n \\ \mathrm{abs}(p) + n, & \mathrm{abs}(p) > n \end{cases}, \quad (3)$$

As the codeword indexes c are conveyed to a decoder, the parameter differences or the parameters can be reconstructed using inverse mapping as follows:

$$p = \begin{cases} i\text{sign}(c)(c + odd(c))/2, & c \leq 2n \\ m\text{sign}(c)(c - n), & c > 2n \end{cases} \quad (4)$$

where isign(c) is equal to −1 for even c values and equal to +1 otherwise, and msign(c) is the sign of the p with maximum absolute value.

In the example where the parameter difference space extends from −6 to 1, or the values of p are −6, −5, −4, −3, −2, −1, 0, 1, we have n=1. Using Equation 3, the mapping result is shown in the following table.

| p | −6 | −5 | −4 | −3 | −2 | | −1 | 0 | 1 |
|---|----|----|----|----|----|---|----|---|---|
| c | 7  | 6  | 5  | 4  | 3  | | 2  | 0 | 1 |

As it can be seen in the table, c is now an increasing function of the absolute value of p. That is, when the deviation from the prediction increases, the codeword index c also increases. This allows efficient use of universal variable-length codes (VLCs) such as Exponential Golomb Codes.

Figure 1:
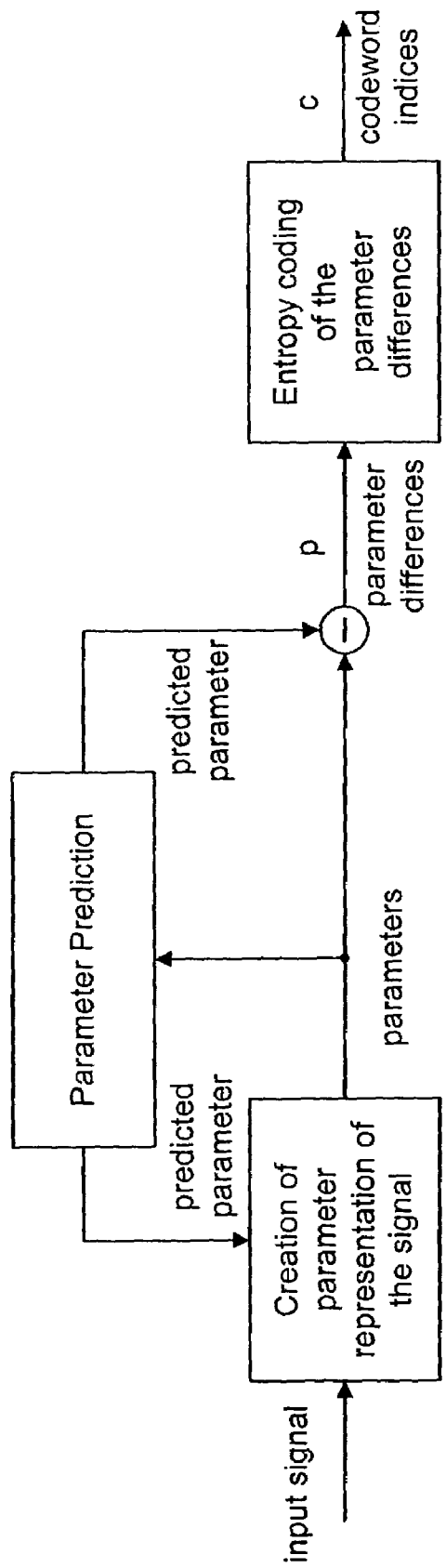
FIG. 1 is a block diagram showing a prior art encoder.
Figure 2:
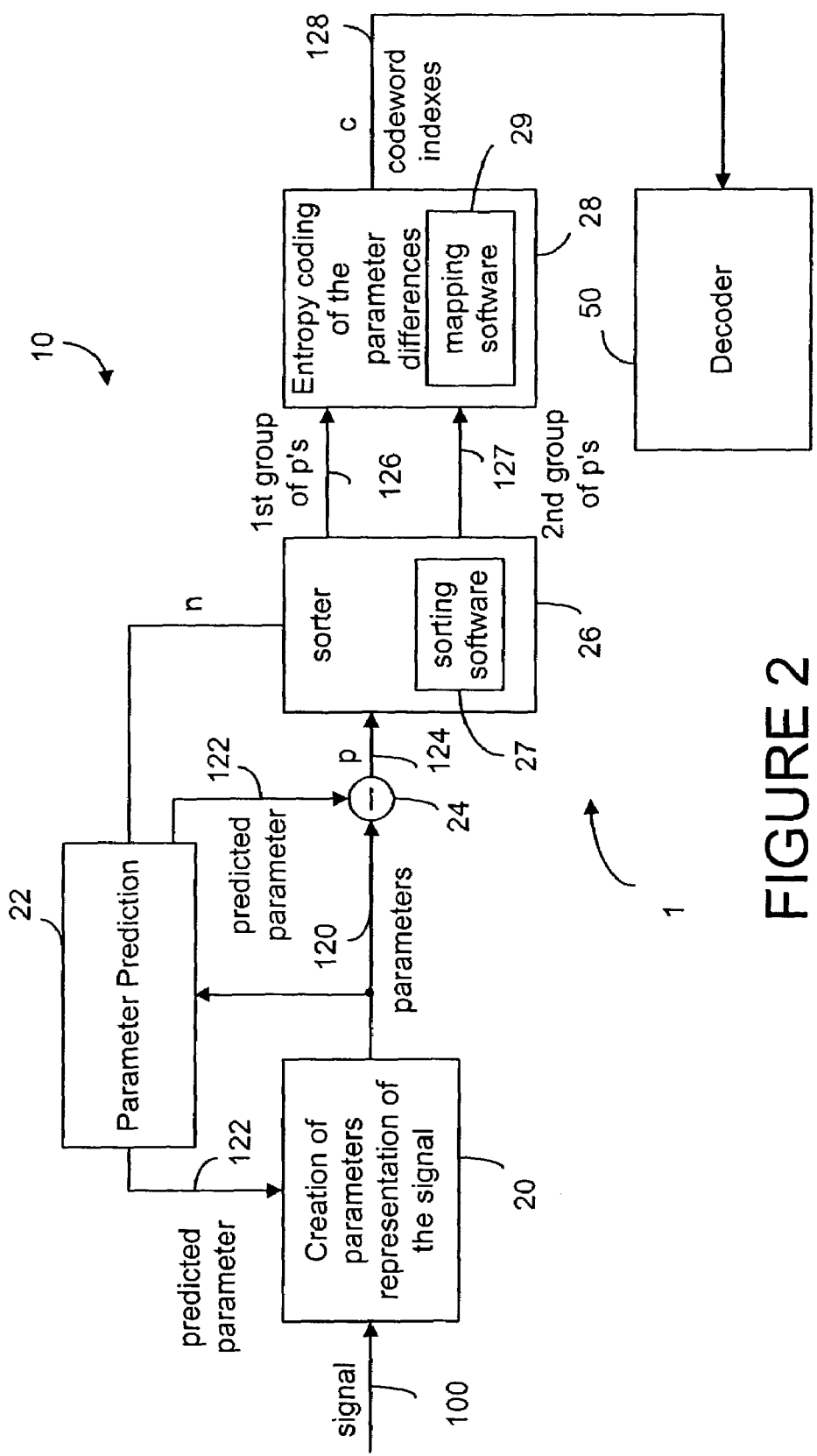
FIG. 2 is a block diagram showing an encoder, according to the present invention, included in an entropy coding and decoding system.

In order to carry out the coding method, as described in conjunction with Equations 3 and 4, a sorting module is included in the entropy coding module, as shown in FIG. 2. As such, the parameter differences or the parameters can be sorted in reference to a selected value n prior to entropy coding. As shown in FIG. 2, the video coding/decoding system 1 comprises an encoder 10 and a decoder 50. As video signal 100 indicative of an image segment is provided to the parameter creation block 20, a set of parameters 120 indicative of the coded signal are obtained. Based on the parameters indicative of the past image segments and the current image segment, a parameter prediction block 22 provides a set of predicted parameters 122. The parameter differences p, denoted by reference numeral 124, are computed from a subtracting module 24. The parameter differences p are conveyed to a sorting module 26 for sorting. At the same time, a selected value n is provided to the sorting module 26 by the parameter prediction block 22. Preferably, the sorting is carried out a software program 27.

If the absolute value of a parameter difference p is smaller than or equal to n, then that parameter difference p is put into a first group 126, so that the codeword index c corresponding to that parameter difference p is mapped according to 2abs(p)−sign(p). For example, with n=1, the first group contains p=−1, 0, 1. If p=−1, then c—2 because sign(−1)=0. Likewise, c=0 if p=0. If p=1, sign(p)=1 and c=1. However, if the absolute value of p is greater than n, then p is put into a second group 127, so that the codeword index c corresponding to that p is mapped according to abs(p)+n. Preferably, the mapping is carried out by a software program 29 in the entropy coding block 28 for providing a signal 128 indicative of the codeword indexes.

Figure 3:
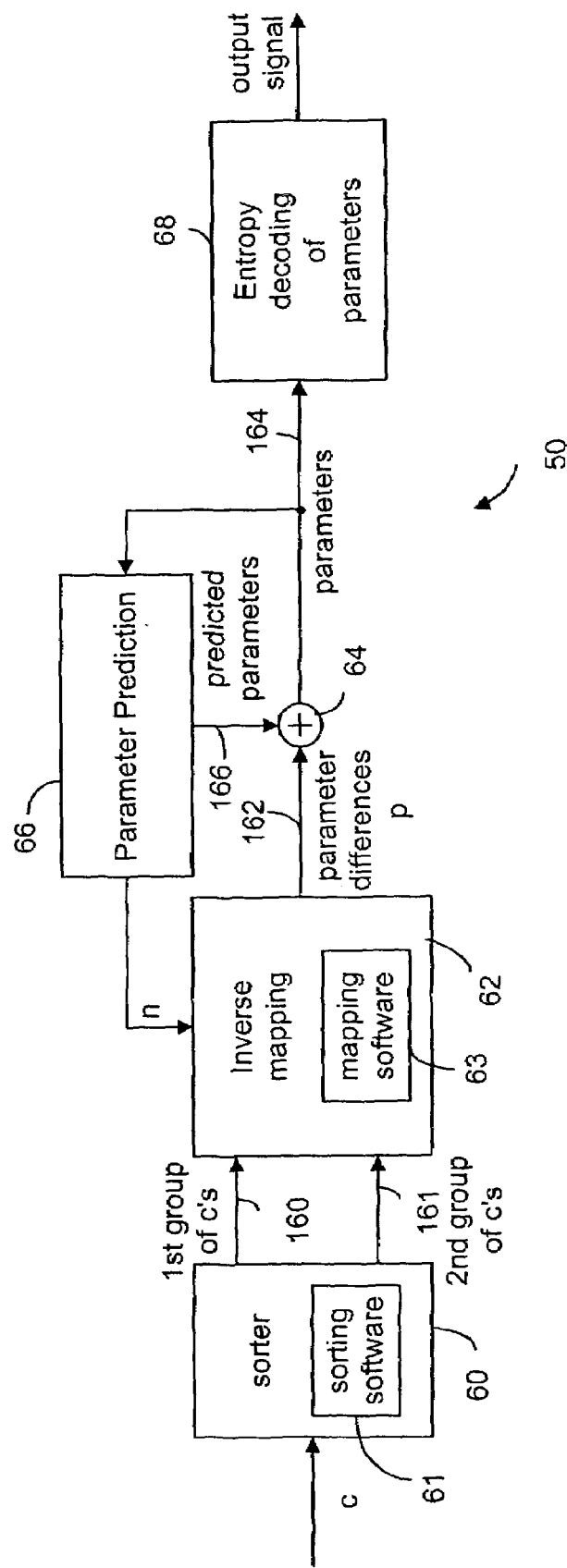
FIG. 3 is a block diagram showing a decoder, according to the present invention.

In the decoder 50, an identical parameter prediction block 66 is used to provide the parameter n, as shown in FIG. 3, so that the inverse mapping from the codeword indexes c into p can be carried out. As shown in FIG. 3, the decoder 50 has a sorter 60 for sorting the codeword indexed c according to Equation 4. Preferably, the sorting is carried out by a software program 61. If c is smaller than or equal to 2n, that c is put in a first group 160 so that the parameter difference p can be computed by an inverse mapping module 62 according to p=isign(c)[c+odd(c)]/2. If c is greater than 2c, that c is put in a second group 161 so that p can be computed according to p=msign(c)(c−n) by the inverse mapping module 62. Preferably, the mapping is carried out by a software program 63. The parameter differences p, denoted by reference numeral 162 is summed with predicted parameters 166 by a summing module 64 to yield a set of parameters 164. These parameters are decoded by an entropy decoder 68.

In the preferred embodiment of the invention, the Quantization Parameters (QP) of a video coding system are coded and decoded. In this embodiment, the QPs have a range from 0 to 31. When a new QP is to be transmitted, the difference between the new QP and the most recently transmitted one is calculated and a codeword index is obtained using Equation 3. After receiving the codeword index, the decoder will apply Equation 4 to find the QP difference. Finally, the new QP value is obtained by adding the received QP difference to the previous QP value.

The present invention can be implemented in various ways:

Equations 3 and 4 can be written in various ways to generate identical mapping. For example, sign(p) can be defined differently such that sign(p)=0 for p smaller than or equal to 0, otherwise sign(p)=1. Furthermore, p can be sorted into three groups as follows:
c=0, if p=0
c=2abs(p)−sign(p), if abs(p)<=n, but larger than 0
c=abs(p)+n, if abs(p)>n If both positive and negative parameters (or parameter differences) are valid and have the same absolute value, Equations 3 and 4 map the positive parameters before the negative one. This can be reversed.

In addition to parameter differences, absolute parameter values can also be coded using the approach described by this invention.

The parameter space does not have to be continuous. For example, zero values can be indicated by other means and Equations 3 and 4 can be modified accordingly.

The approach is not limited to VLC coding but can also be used in the case of other entropy coding methods, such as arithmetic coding.

The present invention has been disclosed in reference to video coding. However, the same method can be used in audio coding and still image coding. It can also be used in data coding for transmission or storage.

Thus, although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A method of coding an input signal for providing a set of parameters indicative of the coded signal, wherein differences between the parameters and a predicted value are further mapped in an encoder into a plurality of codeword indexes, the codeword indexes indicative of a plurality of codewords for use in coding the differences or parameters, so as to allow a decoder to reconstruct the input signal based on the codewords, said coding method comprising:

sorting the differences or parameters into at least a first group and a second group;

mapping the differences or parameters in the first group based on absolute values and signs of the differences or parameters; and mapping the differences or parameters in the second group based on the absolute values.

2. The method of claim 1, wherein the sorting is based on the absolute values of the differences or parameters such that the absolute value of each of the differences or parameters in the first group is equal to or smaller than a selected value.

3. The method of claim 2, wherein the codeword indexes mapped from differences or parameters in the second group are indicative of the sum of the absolute values of the differences or parameters and the selected value.

4. The method of claim 1, wherein said mapping is performed such that the codeword indexes corresponding to said differences or parameters are contiguously assigned.

5. The method of claim 1, wherein the input signal is indicative of a video signal derived from at least an image segment of a video sequence.

6. The method of claim 1, wherein the parameters comprise quantization parameters of a video coding system.

7. The method of claim 1, wherein the input signal comprise a video signal in a video coding system.

8. The method of claim 1, wherein the input signal comprises an audio signal in an audio coding system.

9. The method of claim 1, wherein the input signal comprises in a data signal in a data coding system.

10. An entropy encoder for coding an input signal for providing an encoded signal, said encoder adapted for
   providing a set of parameters indicative of the coded signal;
   at least a predicted value;
   differences between the parameters and the predicted value; and
   a plurality of codeword indexes, the codeword indexes indicative of a plurality of codewords for use in coding the differences or parameters, so as to allow a decoder to reconstruct the input signal based on the codewords, said encoder comprising:
   a sorting module for sorting the differences or parameters into at least a first group and a second group;
   a mapping module, operatively connected to the sorting module, for mapping
      the differences or parameters in the first group based on absolute values and signs of the differences or parameters, and
      the differences or parameters in the second group based on the absolute values, so as to provide said plurality of codeword indexes.

11. The encoder of claim 10, wherein the sorting is based on the absolute values of the differences or parameters such that the absolute value of each of the differences or parameters in the first group is equal to or smaller than a selected value.

12. The encoder of claim 11, wherein the codeword indexes mapped from the differences or parameters in the second group are indicative of the sum of the absolute values of the differences or parameters and the selected value.

13. The encoder of claim 10, wherein said mapping is performed such that the codeword indexes corresponding to said differences or parameters are contiguously assigned.

14. The encoder of claim 10, wherein the input signal is indicative of a video signal derived from at least an image segment of a video sequence in a video coder and said encoder is provided in the video coder.

15. An entropy decoder for reconstructing a coded signal from a set of codeword indexes, said decoder adapted for
   providing a predicted value of the coded signal;
   converting the set of codeword indexes to a set of parameter differences;
   providing a set of parameters indicative of the coded signal, said decoder comprising:
      a sorting module for sorting the codeword indexes into at least a first group and a second group; and
      a mapping module, operatively connected to the sorting module, for mapping the codeword indexes in the first group based on whether the codeword indexes are even numbers or odd numbers, and mapping the codeword indexes in the second group based on differences between the codeword indexes and a selected value, so as to provide the parameter differences.

16. The decoder of claim 15, wherein the sorting is based on values of codeword indexes in relation to the selected value such that each of the codeword indexes is equal to or smaller than two times the selected value.

17. The decoder of claim 16, wherein each of the parameter differences mapped from the codeword indexes in the second group is computed from p=msign(c)(c−n), where msign(c) is the sign of the p with maxiumum absolute value.

18. An entropy coding and decoding system comprising:
   a decoder, and
   an encoder for coding an input signal for providing an encoded signal as claimed in claim 10.

19. A software application product comprising a computer readable medium having a software application for use in an encoder, that is used for coding an input signal for providing an encoded signal, wherein the encoder is adapted for providing a set of parameters indicative of the coded signal;
   at least a predicted value;
   differences between the parameters and the predicted value; and
   a plurality of codeword indexes, the codeword indexes indicative of a plurality of codewords for use in coding the differences or parameters, so as to allow the decoder to reconstruct the input signal based on the codewords, said software application comprising:
      a code for sorting the differences or parameters into at least a first group and a second group; and
      a code for mapping
         the differences or parameters in the first group based on absolute values and signs of the differences or parameters, and
         the differences or parameters in the second group based on the absolute values, so as to provide said plurality of codeword indexes.

20. The software application product of claim 19, wherein the sorting is based on the absolute values of the differences or parameters such that the absolute value of each of the differences or parameters in the first group is equal to or smaller than a selected value.

21. The software application product of claim 20, wherein the codeword indexes mapped from the differences or parameters in the second group are indicative of the sum of the absolute values of the differences or parameters and the selected value.

22. A software application product comprising a computer readable medium having a software application for use in a decoder, which is used for reconstructing a coded signal from a set of codeword indexes, wherein the decoder is adapted for
   providing a predicted value of the coded signal;
   converting the set of codeword indexes to a set of parameter differences; and
   providing a set of parameters indicative of the coded signal, said software application comprising:
      a code for sorting the codeword indexes into at least a first group and a second group; and
      a code for mapping the codeword indexes in the first group based on whether the codeword indexes are even numbers or odd numbers, and mapping the codeword indexes in the second group based on differences between the codeword indexes and a selected value, so as to provide the parameter differences.

23. The software application product of claim 22, wherein the sorting is based on values of codeword indexes in relation to the selected value such that each of the codeword indexes is equal to or smaller than two times the selected value.

24. The software application product of claim 23, wherein each of the parameter differences mapped from the codeword indexes in the second group is computed from p=msign(c)(c−n), where msign(c) is the sign of the p with maxiumum absolute value.

25. An entropy encoder for coding an input signal for providing an encoded signal, said encoder adapted for providing a set of parameters indicative of the coded signal; at least a predicted value; differences between the parameters and the predicted value; and a plurality of codeword indexes, the codeword indexes indicative of a plurality of codewords for use in coding the differences or parameters, so as to allow a decoder to reconstruct the input signal based on the codewords, said encoder comprising:
  means for sorting the differences or parameters into at least a first group and a second group; and
  means, operatively connected to said means for sorting, for mapping
    the differences or parameters in the first group based on absolute values and signs of the differences or parameters, and
    the differences or parameters in the second group based on the absolute values, so as to provide said plurality of codeword indexes.

26. The encoder of claim 25, wherein the sorting is based on the absolute values of the differences or parameters such that the absolute value of each of the differences or parameters in the first group is equal to or smaller than a selected value, and the codeword indexes mapped from the differences or parameters in the second group are indicative of the sum of the absolute values of the differences or parameters and the selected value.

27. An entropy decoder for reconstructing a coded signal from a set of codeword indexes, said decoder adapted for
  converting the set of codeword indexes to a set of parameter differences; and
  providing a set of parameters indicative of the coded signal, said decoder comprising:
  means for sorting the codeword indexes into at least a first group and a second group; and
  means, operatively connected to said means for sorting, for mapping the codeword indexes in the first group based on whether the codeword indexes are even numbers or odd numbers, and mapping the codeword indexes in the second group based on differences between the codeword indexes and a selected value, so as to provide the parameter differences.

28. The decoder of claim 27, wherein the sorting is based on values of codeword indexes in relation to the selected value such that each of the codeword indexes is equal to or smaller than two times the selected value, and each of the parameter differences mapped from the codeword indexes in the second group is computed from p=msign(c)(c−n), where msign(c) is the sign of the p with maxiumum absolute value.

* * * * *

UNITED STATES PATENT AND TRADEMARK OFFICE
CERTIFICATE OF CORRECTION

PATENT NO. : 7,342,965 B2 Page 1 of 1
APPLICATION NO. : 10/423486
DATED : March 11, 2008
INVENTOR(S) : Jani Lainema It is certified that error appears in the above-identified patent and that said Letters Patent is hereby corrected as shown below:

Title page, item [57]
In the abstract, line 18, "indexex" should be --indexes--.

Signed and Sealed this

First Day of July, 2008

JON W. DUDAS
*Director of the United States Patent and Trademark Office*